United States Patent [19]

Keep

[11] Patent Number: 4,985,293

[45] Date of Patent: Jan. 15, 1991

[54] POLYMER BLEND FOR MOLDED CIRCUIT BOARDS AND OTHER SELECTIVELY CONDUCTIVE MOLDED DEVICES

[75] Inventor: Gerald T. Keep, Kingsport, Tenn.

[73] Assignee: Eastman Kodak Company, Rochester, N.Y.

[21] Appl. No.: 393,426

[22] Filed: Aug. 14, 1989

[51] Int. Cl.$^5$ .............................................. B32B 9/00
[52] U.S. Cl. ................................. 428/209; 428/411.1; 428/901; 525/534; 264/104
[58] Field of Search .................... 428/411.1, 209, 901, 428/704, 516, 520; 525/534; 264/104

[56] References Cited

U.S. PATENT DOCUMENTS

| | | | |
|---|---|---|---|
| 3,971,870 | 7/1976 | Christensen et al. | 428/336 |
| 4,457,951 | 7/1984 | D'Amico et al. | 427/96 |
| 4,520,067 | 5/1985 | Harris et al. | 428/323 |
| 4,554,182 | 11/1985 | Bupp et al. | 427/304 |
| 4,592,929 | 6/1986 | Tubergen et al. | 427/98 |
| 4,594,311 | 6/1986 | Frisch et al. | 430/315 |
| 4,601,783 | 7/1986 | Krulik | 156/655 |
| 4,610,895 | 9/1986 | Tubergen et al. | 427/98 |
| 4,756,968 | 7/1988 | Ebe | 428/343 |
| 4,853,286 | 8/1989 | Narimatsu | 428/40 |

FOREIGN PATENT DOCUMENTS

| | | | |
|---|---|---|---|
| 0252739 | 1/1988 | European Pat. Off. | 428/343 |
| 54-84474 | 7/1979 | Japan . | |
| 0196380 | 11/1984 | Japan | 428/343 |
| 3108090 | 5/1988 | Japan | 428/343 |
| 1104682 | 4/1989 | Japan | 428/343 |

OTHER PUBLICATIONS

CA 104 (26): 225907s, Robeson et al., Article Molded from PEEK and PAES.
Thomas et al., "Solid Source Diffusion Process for Silicon Solar Cells", Fourteenth IEEE Photovoltaic Specialists Conference, pp. 811–814, Jan. 7–10, 1980.

*Primary Examiner*—Patrick, J. Ryan
*Attorney, Agent, or Firm*—John F. Stevens; William P. Heath, Jr.

[57] ABSTRACT

The use of an amorphous polymer blended with a semicrystalline polymer to render the latter susceptible to adhesion promotion for good peel strength after electroless copper plating, while maintaining the advantages of the semicrystalline polymer including high temperature characteristics, ease of molding, and low cost is disclosed. The invention provides an injection-moldable material with the advantages of a semicrystalline thermoplastic but that can be made to accept electroless metal deposits for fabrication of electronic devices. The material is a blend including a high-temperature semicrystalline thermoplasstic polymer with an amorphous polymer that is easily etched and that is preferably compatible with the semicrystalline polymer. A preferred exemplary blend comprises poly(cyclohexylenedimethylene terephthalate) with polyethersulfone and/or polyarylate.

18 Claims, No Drawings

POLYMER BLEND FOR MOLDED CIRCUIT BOARDS AND OTHER SELECTIVELY CONDUCTIVE MOLDED DEVICES

FIELD OF THE INVENTION

The invention relates to materials for molding printed circuit boards and other selectively conductive molded devices, methods of manufacturing such items, and the items themselves.

DISCUSSION OF THE BACKGROUND

Circuit boards are widely used in the electrical industry for radio, television, computers, appliances, industrial and electronic equipment. Printed circuit boards have been traditionally manufactured from copper clad epoxy-glass laminates.

When starting with this material the shape of the printed circuit board must first be routed out and the holes for mounting the components (e.g., transistors, resistors, integrated circuits, etc.) individually drilled. The board is then masked with photoresist, the circuitry imaged and the copper etched away from areas where it is not wanted.

An alternative to this procedure is to injection mold the circuit board substrate with the holes in place or even with parts such as clips and bosses as part of the molded board. The molded substrate is then put through several adhesion promotion steps and plated with electroless copper according to standard technology, to produce the printed circuit board.

In this case the substrate material is limited to thermoplastic resins with sufficient thermal stability and chemical properties to survive wave soldering. Savings may result with these injection molded circuit board substrates due to the elimination of considerable mechanical processing such as routing and drilling.

The critical parameters of a printed circuit board, from a soldering standpoint, are its heat deflection temperature, environmental stress crack resistance and thermal expansion coefficient. The higher a substrate's heat deflection temperature and environmental stress crack resistance to solder fluxes, the less likely it will blister or delaminate during soldering. Similar advantages of molded substrates in manufacture of other parts with selected portions metalized can be seen, even when their environmental and thermal requirements are different.

Methods for the electrochemical and electroless deposition of copper and other metals onto activated substrates are well known and defined in the art and will not be detailed herein. Methods for manufacturing planar printed circuit boards from metal/resin laminates by subtractive etching of the copper are also well documented in the art.

Recent developments in the art include the use of features in molded circuit boards. One example is a molded-in pattern of recesses which, when the raised portions are coated with a resist or are selectively metal plated, define the circuit traces.

This technology is disclosed in U.S. Pat. Nos. 4,532,152, 4,651,417 and 4,6687,603. Use of these techniques requires a material onto which copper may be plated at some stage after the molding of the part.

A large number of documents in the literature discuss imaging circuit traces by selective deposition of metal particles followed by electroless plating of a metal. These include U.S. Pat. Nos. 3,629,922, 3,772,056, 3,772,078, 3,907,621, 3,930,963, 3,959,547, 3,993,802, 3,994,727, 4,511,597, 4,594,311 and 4,666,739. In these techniques, it is important to adhesion promote the surface of the item to be plated in order to get good mechanical adhesion of the electoless metal deposit.

Other methods for initiating metallization of previously inert plastic substrates can be found in U.S. Pat. Nos. 4,327,124, 4,447,471, 4,478,883, 4,493,861 and 4,554,182. These include activation by special inks, bromine compounds, and ionic polymers. In some cases these require adhesion promotion of the substrate, and/or a chemical attack to modify wettability is needed.

Other examples exist in which the catalyst for electroless plating is incorporated into the material formulation itself, as in U.S. Pat. No. 3,629,185 and 4,281,038. These catalysts include metal particles and metal-coated particles.

The image of the circuit trace can be obtained by various methods known in the art, including use of resists before or after initial cooper plating, or by overmolding with a noncatalytic resin as disclosed in European Patent Application Nos. 0 256 428 and 0 192 233. In these cases, it is necessary to etch the material both to promote good adhesion and to expose the catalytic particles, which are generally remote from the original molded surface of the device.

The demand for nonconductive moldable materials that will accept electroless deposits of copper and other metals is thus clear. In common in all the above techniques of electroless metal deposits is the need to etch, adhesion promote, or otherwise modify the surface of such a molded part.

Many techniques for chemical etching of thermoplastics are disclosed in the literature including U.S. Pat. Nos. 4,457,951, 4,592,852, 4,592,929, 4,595,451, 4,601,783, 4,610,895 and 4,629,636. In general, these techniques require the material to be wet or penetrated by reagents or solvents.

Alternative methods utilizing plasmas, as in U.S. Pat. Nos. 4,337,279 and 4,402,998 are more expensive and difficulties are encountered with uniform etching and penetration into holes. For these reasons chemical etching methods involving solvent penetration into the material are preferred.

Available materials are, however, limited in scope due to this need for chemical attack, which is usually dependent on penetration of a solvent into the material. This is best accomplished with an amorphous polymer, which typically has low solvent resistance, as compared to a semicrystalline polymer. Thus, the most common polymers used in the art for molded circuit boards, polyethersulfone (PES) and polyetherimide (PEI) are amorphous polymers.

There are many advantages to use of semicrystalline polymers. A property of prime importance in the field of molded circuit boards is a high heat deflection temperature (HDT) since in many cases it is desirable to solder electrical components onto these devices, generally at temperatures in the range of 230° to 290° C. HDT is measured via ASTM D648, however, tests for dimensional stability of the molded parts in these temperature ranges are the standard by which sufficiently "high HDT" is judged.

For an amorphous polymer this requires a very high glass transition temperatures (Tg) which restricts the available polymers to an elite group. These polymers are typically expensive, require high processing temperature, and have very poor flow characteristics.

Semicrystalline polymers, on the other hand, can be compounded with glass fibers or other fillers to give an HDT determined more by their melting temperature (Tm) rather than their Tg. Generally, at least about 10% glass fiber is needed. This allows much higher HDT's than would otherwise be indicated by their low melt viscosities and processing temperatures.

This would allow for use of much less expensive polymers with lower processing temperatures and good flow characteristics. For example, poly(cyclohexylenedimethylene terephthalate) (PCT) and crystallizable copolymer thereof, a polyester having repeat units from terephthalic acid and 1,4-cyclohexanedimethanol, can withstand total immersion in a 260° C. solder bath for a full minute with little ill effect while PES, which has similar processing temperature with higher melt viscosity, and is more expensive, has a Tg about 40 degrees below such a 260° C. bath.

Examples of materials in use in the industry are given in Table 1 along with some potentially competitive semicrystalline polymers, poly(ethylene terephthalate) (PET) and crystallizable copolymer thereof, a polyester having repeat units from terephthalic acid and ethylene glycol and PCT. Semicrystalline polymers clearly would be competitive on cost and HDT if they could be made to accept electroless metal plating with good adhesion.

TABLE 1

| Platable High Temperature Thermoplastics | |
|---|---|
| Polymer | HDT* (°C.) |
| Polyarylate (PA) | 155–179 |
| Polysulfone (PS) | 168–181 |
| Polyetherimide (PEI) | 197–223 |
| Polyethersulfone (PES) | 203–216 |
| GFR** PET | 216–243 |
| GFR** PCT | >260 |

*Range of HDT depends on amount of filler. (Information from various issues of the publication Plastics World.)
**Glass Fiber Reinforced (GFR), and in a crystalline state.

U.S. Pat. No. 4,520,067 discloses the use of a polymer blend of two amorphous polymers, PES and PS. While both polymers are useful alone, the blend has better etchability than the PES and higher HDT than the PS. This blending thus achieves properties that are intermediate between the two components but is qualitatively the same as both components of the blend, which are themselves both amorphous polymers that are substantially etchable.

There is, however, still a need for a composition which would utilize semicrystalline polymers in molded articles which would accept electroless plating to thereby derive benefits in terms of physical properties from the semicrystalline polymer while still achieving good copper adhesion as is seen with amorphous polymer.

SUMMARY OF THE INVENTION

Accordingly, it is an object of this invention to provide a method for formulating semicrystalline polymers to accept electroless plating.

It is another object of this invention to provide a semicrystalline polymer-containing resin which can accept electroless plating.

It is another object of this invention to provide a novel circuit board substrate or a substrate for making a selectively conductive device.

It is another object of this invention to provide a method for making a novel circuit board substrate or a novel substrate for making a selectively conductive device, which uses a novel substrate material.

The inventor has now discovered that these objects and other objects of this invention are satisfied by using a material which is a blend of a semicrystalline thermoplastic polymer with an amorphous polymer which is easily etched and preferably compatible with the semicrystalline polymer.

DETAILED DESCRIPTION OF THE PREFERRED EMBODIMENTS

The present invention provides a method by which semicrystalline polymeric materials can be formulated to accept electroless plating.

The words "amorphous" and "crystalline" used in this text either refer to a material's inherent ability to crystallize when referring to a material type, or alternatively its current state of crystallinity for a semicrystalline material when referring to a particular object, depending on context.

For the purposes of this document, the term "semicrystalline" is used to indicate a material that is capable of some substantial degree of crystallinity (i.e. materials capable of being prepared without crystallinity and which may be made to contain up to 60% crystallinity). Thus, in this manuscript, the term "semicrystalline" refers to materials which are capable of being prepared without crystallinity but which can be modified to contain up to 60% crystallinity, preferably about 10–60% crystallinity as measured by conventional techniques known in the art. For example, see Journal of Applied Polymer Science, Vol. 33, pp 29–39 (1987) "Annealing Effects on the Crystallinity of Polyetheretherketone (PEEK) and its Carbon Fiber Composite" and Polymer Science U.S.S.R. Vol. 28, No. 1, pp 113–119 (1986) "The Determination of Crystallinity of New Polymers (Polyimides and Other Polyheteroarylenes." Differential Scanning Calorimetry techniques are also useful in determining crystallinity, as is known in the art. Normally, crystalline polyesters contain about 10–40% crystallinity.

As noted above, the prior art discloses blends of amorphous thermoplastic materials. The present invention provides, for the first time, the use of semicrystalline polymeric materials formulated to accept electroless plating.

The use of the words "mold" or "molded" herein refer generically to any method of shaping a thermoplastic material including but not limited to injection and compression molding, extrusion and pultrusion, pressing, stamping, thermoforming, and rotational molding.

Heretofore, although crystalline polymers have the advantage of higher use temperatures for a given Tg and molecular weight, no crystalline polymers have been found that are suitable for use in making molded circuit boards or other selectively conductive molded devices.

Surprisingly, it has now been discovered by the inventor that blends of semicrystalline polymers with amorphous polymers can have the utility of the amorphous polymers while retaining the high temperature stability of the crystalline polymers. This allows for a novel class of high temperature, low viscosity, low cost materials for fabrication of selectively conductive molded devices. These materials can also be used in applications in which the metal plating is for decorative rather than electrical purposes.

In the broadest sense, this invention provides materials with improved properties (including HDT, solvent resistance, strength, etc.) and at lower cost for applications requiring electroless metal plating.

In the broadest sense, the invention is a blend of any semicrystalline thermoplastic polymer with one or more amorphous thermoplastic polymer which are at least macroscopically compatible if not thermodynamically miscible with the semicrystalline material. In this context, as noted above, the term "semicrystalline thermoplastic polymer" is intended to encompass all the thermoplastic materials capable of exhibiting at least some crystallinity or crystalline character. The term "amorphous thermoplastic polymer" is intended to encompass all thermoplastic materials incapable of exhibiting any substantial degree of crystallinity.

Broadly, the blend of the present invention may contain from about 1 to about 99 wt% of the semicrystalline thermoplastic polymer and from about 99 to about 1 wt% of the amorphous thermoplastic polymer.

Preferably, if the amorphous thermoplastic polymer is miscible in the semicrystalline thermoplastic polymer, the amorphous thermoplastic polymer is used in an amount of from 1 to 99 wt% of the composition, most preferably in an amount of from 1 to 25 wt% of the composition.

If the amorphous thermoplastic polymer is not miscible in the semicrystalline thermoplastic polymer, the amorphous thermoplastic polymer is used in an amount of from 5 to 99 wt% of the composition, preferably in an amount of from 5 to 85 wt%.

It should be understood that both the amorphous and semicrystalline polymers should have a molecular weight high enough to be moldable, but not so high that they cannot be processed by conventional means.

The blend is molded under conditions that minimize crystallinity, then swollen with a solvent under conditions that minimize solvent crystallization, etched, and finally annealed to recover the desired crystallinity and HDT.

Conventional electroless plating procedures include first exposing the substrate to one solvent to swell the surface, followed by a conventional etching procedure. Conventional etching procedures commonly include subjecting the substrate to an oxidizing or reducing solution such as chromic acid dissolved in sulfuric acid or a caustic permangate, followed by neutralization, and washing(s) which may include weak neutralizing agents, surfactants, etc., prior to plating.

The solvent which is used to swell the blend is selected to have a solubility parameter reasonably close to that of the polymer blend. Any solvent capable of swelling the polymeric blend may be used, but water soluble solvents are preferred.

Examples of solvents which may be used include dimethylformamide (DMF), methylethyl ketone (MEK), 1,3-dichloroisopropanol, ethylacetate, butylacetate, γ-butyrolactone, toluene, orthodichlorobenzene, and cyclohexanone.

The solvents used must be selected so that under the process conditions used they do not completely dissolve the polymer blend. Control of temperature can be used to affect a solvent's ability to plasticize or dissolve the polymer blend.

At the end of the preparation, the material is annealed to recover the desired crystallinity and HDT. Since the crystallization of the material will determine its HDT, the annealing procedure is applied until crystallization. However, variations on this procedure are possible. For example, the material may be annealed following the copper plating steps.

Electroless metal plating is then used and allows the fabrication of selectively conductive molded devices with superior HDT at a lower cost.

In one preferred embodiment, the semicrystalline polymer used is PCT due to its ready availability and HDT which is in excess of 260° C. PET may also be used but with a lower cost and HDT than those of PCT. PCT is a polyester containing repeat units from terephthalic acid and 1,4-cyclohexanedimethylene, and molding grades have an I.V. of about 0.4–1.0. PET is a polyester containing repeat units from terephthalic acid and ethylene glycol and molding grades have an I.V. of about 0.4–1.0. Other semicrystalline polymers such as other polyesters [including poly(butyleneterephthalate)], polypropylene, crystalline polyamides, poly(phenylene sulfide) and so forth may also be used.

The amorphous thermoplastics which may be used include but are not limited to polyethersulfone (PES), polysulfone (PS), polyarylsulfone (PAS), polyphenylsulfone (PPS), polyetherimide (PEI), and polyarylate (PA).

The poly(ether sulfone) suitable for use in this invention includes homopolymers, co- and higher polymers having repeating units of the following formula:

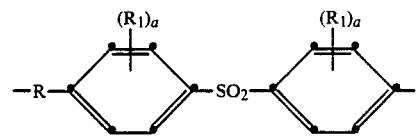

wherein R is O or S, each $R_1$ is independently hydrogen, a halogen atom (i.e. fluorine, chlorine, bromine or iodine), an alkyl group of from 1 to 4 carbon atoms or an alkoxy group of from 1 to 4 carbon atoms and a is an integer of 0 to 4.

Preferably, the poly(ether sulfone) has repeating units of the following formula:

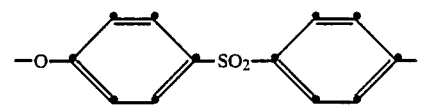

These polymers are well known in the art and are described in, for example, U.S. Pat. Nos. 4,175,175 and 4,008,203.

The polysulfone suitable for use in this invention includes homopolymers and co- and higher polymers having repeating units of the following formula:

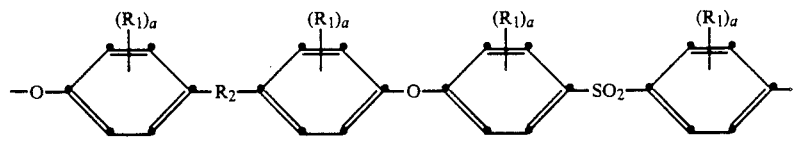

wherein $R_1$ and a are defined as above between aromatic carbon atoms or a divalent connecting radical. Preferably, $R_2$ is a divalent connecting radical of the formula:

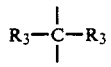

wherein $R_3$ is independently selected from lower alkyl, aryl and halogen substituted groups thereof. Preferably $R_3$ is methyl.

Preferably the polysulfone has repeating units of the formula:

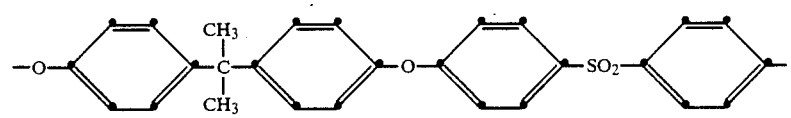

These polymers are well known in the art and are described in, for example, U.S. Pat. No. 4,175,175.

Polyarylates suitable for use in this invention are the condensation products of a glycol of the formula

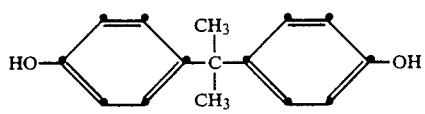

with isophthalic acid or a mixture of isophthalic acid with terephthalic acid.

The polyetherimides, polyethersulfones, polyphenyl sulfone, and polyaryl sulfone suitable for use in this invention include those having any sequence of

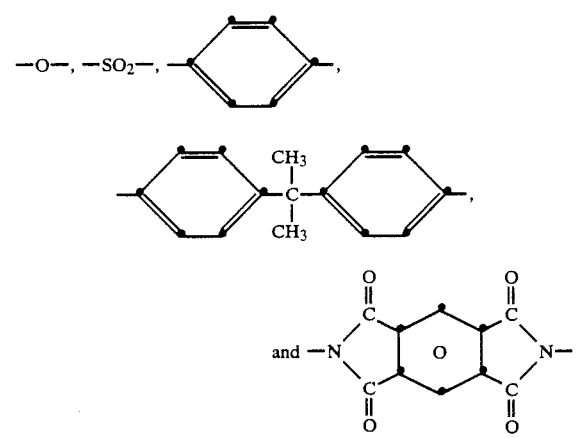

in which no pair of adjacent groups are both either oxygen or sulfone.

PES (VICTREX 3600G) affects the etching and crystallinity of the PCT to a slightly greater extent than PEI. Otherwise, they behave quite similarly. They are chosen for relatively high intrinsic HDT with a cost much below that of PEEK. PES may be used in an amount of from 5 to 85% of the resin, with an ideal range of 15 to 25%.

Another good choice is PA (ARDEL D-100) resin which is more effective at quenching crystallization of PCT, allowing for the use of a smaller percentage of PA, which counterbalances the lower intrinsic HDT of this material. PA can be used in an amount of from 1 to 25% of the resin, with a preferred range of 5 to 15%. Blends including all three polymers in the above ranges may also be used.

As noted supra, recent developments in the art include the use of features in molded circuit boards. One example is a molded-in pattern of recesses which, when the raised portions are coated with a resist or are selectively metal plated, define the circuit traces, as is disclosed in U.S. Pat. Nos. 4,532,152, 4,651,417 and 4,668,603.

It is immaterial to the present invention, however, whether the resist is to be applied before or after the initial plating of copper and whether portions of the plated copper must be later etched away. Use of these techniques requires a substrate material onto which copper may be plated at some stage after the molding of the art.

As also noted supra a wide number of citations in the literature involve imaging the circuit traces by selective deposition of metal particles followed by electoless plating of a metal. These include U.S. Pat. Nos. 3,629,922, 3,772,056, 3,772,078, 3,907,621, 3,930,963, 3,959,547, 3,993,802, 3,994,727, 4,511,597, 4,594,311 and 4,666,739.

Whether the image is formed mechanically or photolithographically is immaterial to the present invention. In these techniques, it is important to use an adhesion promoter on the surface of the item to be plated in order to get good mechanical adhesion of the electroless metal deposit.

The choice of whether to include the electroless plating catalyst in the material formulation or whether to deposit it on the surface of the molded articles is a matter of convenience. The adhesion promotion needs of the two cases do not differ substantially and so this choice is immaterial to the invention.

In all cases, it is recognized in the art that thermoplastic formulations can include minor amounts of additives to affect such properties as color, flame retardancy, oxidative stability, crystallization characteristics, impact and other mechanical properties, and so forth. In the discussion, all formulations allow such variations of additives in accordance with the art.

The blends may thus contain other ingredients such as stabilizers, i.e., metal oxides such as zinc oxide, antioxidants, flame retardants, pigments, fibers, inorganic fillers, and the like. Preferably, the composition contains fibers and/or inorganic fillers.

The reinforcing fiber may suitably be fiberglass. The particulate inorganic fillers which may be used include but are not limited to wollastonite, calcium carbonate, glass beads, talc, mica and the like, or mixtures thereof.

The fiber reinforcement, filler or combinations thereof, is utilized in amounts of from 10 to about 50 weight percent, preferably from about 15 to about 35 weight percent, based on total polymer weight.

The nature and amount of noncatalytic fillers in particular such as glass, mica, talc, etc., is irrelevant to the etching and plating characteristics of the material and will be selected based on other concerns. Generally, some filler such as glass fibers needs to be present to attain high HDT's in semicrystalline materials. These and other additives used in the art are assumed to be present over and above the formula percentage used in the claims.

In some cases, portions of flame retardants (e.g., brominated polystyrenes), rubbery impact modifiers, and the like may be considered an amorphous polymeric component and will behave as disclosed in this invention and will be relevant to the invention as disclosed.

For the purposes of the present discussion, this document considers the operations of etching, adhesion promotion, solvent attack, rendering hydrophilic, etc., to be conceptually similar, in that they may be considered in the following two parts. The first step is that of penetration of the material by a solvating fluid, rendering the material more molecularly accessible. The second step is the actual attack on the material by a reagent such as an acid, a base, an oxidizing agent, a reducing agent, etc., made possible by the first step. Generally, without either prior or simultaneous action of the first step, the second step is ineffective due to low reactivity or speed. An exception to this is the use of a plasma etch.

Most reagents used in the art are based on aqueous solution and most penetrants are organic solvents. Aqueous solutions which may be used include chromic/sulfuric acid mixtures or caustic potassium permanganate ($KMnO_4$). The organic solvents which may be used are chosen to have solubility parameter characteristics which are reasonably close to those of the polymer blend in question. Theoretically any solvent which swells the blend can be used, but water-soluble solvents are preferred. Exemplary solvents which may be used include dimethylformamide, methylethylketone, 1,3-dichloroisopropanol, ethylacetate, butylacetate, γ-butyrolactone, or cyclohexanone, as well as mixtures of these solvents with each other and/or water.

However, there is no conceptual reason why the carrier for the reagent or the reagent itself might not serve in addition as the penetrant. The exact nature of the second step is not here considered vital to this invention, in that any of these in the art may be used. The difficulty in use of semicrystalline thermoplastics lies in the first step, in that the crystallinity inhibits penetration by cheap, readily available, nonhazardous solvents.

The degree of crystallinity in a sample is an important issue in determining its susceptibility to solvent penetration, but also is a requisite for obtaining high HDT in a semicrystalline thermoplastic. Therefore, the crystallinity cannot be totally eliminated. When the blends of the present invention require good high thermal properties, the polymeric blend must crystallize to provide the requisite HDT characteristics. Further, experience has shown that once a sample has been thoroughly crystallized, as for example by treatment in an oven or by molding in a mold hot enough to allow crystallization, the task of etching the plastic is tremendously more difficult.

The expedient of molding a material in a cold mold to prevent crystallinity generally fails due to solvent crystallization. This is the phenomenon that occurs when enough solvent has penetrated the polymer to impart to the polymer chains sufficient mobility that they are able to crystallize, inhibiting further penetration by solvent.

Without wishing to limit the invention, the following explanation is provided for the reader's benefit. It is hypothesized that the current invention has its basis in at least the following two mechanisms.

First, by including in the formulation a small portion of a second, partially miscible polymer and quenching from the melt, the crystallization of the main polymer is slowed by the presence of the second polymer such that solvent crystallization does not occur, or occurs more slowly. However, upon prolonged annealing in an oven, the material has time to phase separate and crystallize, driven by the thermodynamic stability of the crystalline state. Thus, the high HDT of the crystalline material can be recovered after the necessary etching of the material has taken place.

The second mechanism occurs when two phases are present and the amorphous phase absorbs solvent more readily than the semicrystalline phase. This causes microstresses in the material that lead to stress cracks, which in turn expose more surface area to solvent penetration. Thus more solvent penetrates the semicrystalline phase than would be the case in the absence of the second phase. This effect is enhanced by diffusion of solvent through the second phase to reach portions of the first phase not in direct contact with the solvent.

In the two cases of PCT blends with polyarylate, (e.g., ARDEL D-100, which has a 50/50 ratio of the two acids, is one such polymer) and polyethersulfone (PES) (e.g., VICTREX 3600G), it appears that these two mechanisms are active.

With the more miscible PA, multiple phases are not initially observed, dramatic slowing of the crystallization kinetics are seen, and substantial direct etching takes place. With the PES which is only partially miscible, the slowing of crystallization kinetics is not so dramatic, multiple phases are observed in a Scanning Electron Microscope, and the etching is accompanied by substantial microcracking to give a relatively coarse morphology. However, both mechanisms could be at work to different degrees in each case and these hypotheses should in no way be taken to be limiting of the invention.

The PA blends tend towards generating finer morphologies than the PES blends. The finer morphologies give more surface area and hence a better chance for mechanical interlock and good adhesion of the plated metal. However, in applications where the catalyst is incorporated into the blend, the PA may not allow for a deep enough etch to access the catalyst. In these cases, PES would be preferred. Even better is a blend incorporating both amorphous polymers along with the poorly etched semicrystalline material. This gives both a deep etch and a finely textured morphology for better adhesion.

Clearly, many different combinations of compatible and incompatible amorphous polymers may be incorporated into these polymer blends to manipulate the scale and texture of the resultant etch surface. This principle is applicable to any polymer that is difficult to etch.

An extreme application of this invention would utilize a polymer blend with more of the amorphous component than of the semicrystalline material. Such a blend would etch very similarly to the amorphous component alone, yet would hold the advantages of reduced cost, improved HDT, and, in many cases, reduced melt viscosity for easier molding operations.

Having generally described this invention, a further understanding can be obtained by reference to certain specific examples which are provided herein for purposes of illustration only and are not intended to be limiting unless otherwise specified.

EXAMPLES

Step (6) 10 minute rinse in solution of 40 ml 35% $H_2O_2$, 10 ml sulfuric acid per liter, room temperature, Step (7) 1 minute rinse in water, room temperature.

Samples were initially plated with MacDermid's Mac-U-Dep-52 electroless copper, then thickened using an acid electroplating bath.

Peel strengths are measured as-is, following 3 hours annealing in a 150° C. vacuum oven (which crystallizes the PCT), and after floating the annealed samples on a 260° C. solder bath for 10 seconds. Several measurements were made on each sample and the average and standard deviation calculated. Except where noted, the standard deviations were less than ±0.2. Peel strengths are presented in Table 2 below. Note that clearly the blends of this invention yield peel strengths between those of pure PES and pure PCT. Peel strengths are measured with a Chatillion Dial Push-Pull Gauge Model DPP-5. The copper was pulled at 90° to the surface.

TABLE 2

Peel Strength Examples
Peel Strength, #/in (newtons/meter)

| Solvent | Peeled: | Blend: A PES | B PES/PCT | C PCT | D PCT/PES | E PCT/PA | F PCT/PES/PA |
|---|---|---|---|---|---|---|---|
| DMF | As-is | 9.3 (1630) | 1.8 (320) | 1.3 (230) | 4.1 (720) | 2.5 (440) | 3.0 ± .7 (530 ± 120) |
| | Annealed | >10 (>1760) | | 2.1 (370) | 5.9 ± .5 (1040 ± 90) | 2.4 (420) | 4.8 (840) |
| | Solder-pot | >10 (>1760) | | 1.8 (320) | 5.0 ± .3 (880 ± 50) | | 4.2 (740) |
| γ-BL | As-is | 5.6 ± .4 (980 ± 70) | 2.1 ± .5 (370 ± 90) | 0.6 (110) | 2.2 (390) | 1.1 (190) | 3.1 (540) |
| | Annealed | 8.8 (1550) | 3.0 (530) | 1.1 (190) | 4.0 (700) | 2.6 (460) | 4.1 (720) |
| | Solder-pot | >10 (>1760) | 1.8 (320) | 1.2 (210) | 3.3 (580) | 3.3 (580) | 4.0 (700) |

Six different blends were compared for illustrating this invention. They were:

Blend A—"Pure PES"—3% CAT-10 catalytic powder from Johnson-Matthey, 20% Owens Corning 492AA ⅛" chopped glass fiber, 77% Victrex 3600G PES.

Blend B—"PES/PCT"—3% CAT-10, 20% glass fiber, 64% PES, 13% PCT.

Blend C—"Pure PCT"—3% CAT-10, 20% glass fiber, 77% PCT.

Blend D—"PCT/PES"—3% CAT-10, 20% glass, 54% PCT, 23% PES.

Blend E—"PCT/PA"—3% CAT-10, 30% glass fiber, 47% PCT, 20% Ardel D-100 PA.

Blend F—"PCT/PES/PA"—3% CAT-10, 20% glass fiber, 47% PCT, 20% PES, 10% PA.

All blends were compounded on single screw extruders in the vicinity of 310° C. and injection molded into 23° C. molds.

The samples were etched by the following procedure, using two different choices of solvents:

Step (1) 1 minute in either 5% $H_2O$ in dimethylformamide (DMF) at 66–68° C., or γ-butyrolactone (γ-BL) at 65–66° C., Step (2) 5 minutes in a 0.4 g/l solution of GAFAC-RE610 surfactant (GAF) at 58–49° C.

Step (3) 1 minute in 20% sulfuric acid at 64–66° C.

Step (4) 3 minutes in a solution of 375 g/l $CrO_3$, 20% sulfuric acid, plus 0.5 g/l Fluorad FC-98 surfactant (3M) at 66–67° C., Step (5) 1 minute rinse in water, room temperature, As used herein, the inherent viscosity (I.V.) is measured at 25° C. using 0.50 g of polymer per 100 mL of a solvent consisting of 60% by weight phenol and 40% by weight tetrachloroethane.

Obviously, numerous modifications and variations of the present invention are possible in light of the above teachings. It is therefore to be understood that within the scope of the appended claims, the invention may be practiced otherwise than as specifically described herein.

I claim:

1. A selectively conductive molded article, comprising a blend containing about 1 to about 99 wt% of an amorphous thermoplastic polymer and about 99 to about 1 wt% of a semicrystalline thermoplastic polymer.

2. The selectively conductive molded article of claim 1, wherein:

said amorphous thermoplastic polymer is at least one member selected from the group consisting of polyethersulfone, polysulfone, polyarylsulfone, polyphenylsulfone, polyetherimide, polyimide, and polyarylate; and said semicrystalline thermoplastic polymer is at least one member selected from the group consisting of polyesters, polypropylenes, crystalline polyamides, and poly(phenylene sulfides), poly(ether ether ketones).

3. The selectively conductive molded article of claim 1, wherein the semicrystalline thermoplastic polymer comprises poly(cyclohexylene dimethylene terephthalate), poly(ethylene terephthalate) or poly(butyleneterephthalate).

4. The selectively conductive molded article of claim 1, wherein the semicrystalline polymer is poly(cyclohexylene dimethylene terephthalate).

5. The selectively conductive molded article of claim 1, wherein said amorphous thermoplastic component is polyethersulfone present in an amount of from 5 to 85% by weight of the blend.

6. The selectively conductive molded article of claim 1, wherein said amorphous thermoplastic component is polyarylate present in an amount of from 1 to 25 wt% of the blend.

7. A method of producing a selectively conductive molded article comprising:
(i) molding together, under conditions that minimize crystallinity a blend of 1 to 99 wt% of an amorphous thermoplastic polymer and 99 to 1 wt% of a semicrystalline thermoplastic polymer to obtain a molded article;
(ii) swelling the surface of said molded article with a solvent under conditions which minimize solvent crystallization to render the polymer susceptible to etching;
(iii) etching said molded article to obtain an etched product; and
(iv) annealing said etched product to obtain a desired crystallinity and HDT in said product.

8. The method of claim 7, comprising using, as said solvent, dimthylformamide, methylethylketone, 1,3-dichloroisopropanol, ethylacetate, butylacetate, toluene, γ-butyro lactone, orthodichlorobenzene, cyclohexanone, or a mixture of these.

9. The method of claim 8, wherein said amorphous thermoplastic component is at least one member selected from the group consisting of polyether sulfone, polysulfone, polyetherimide, polyether etherketone, and polyarylate, and wherein said semicrystalline thermoplastic component is at least one member selected from the group consisting of polyesters, polypropylenes, crystalline polyamides, and poly(phenylene sulfides).

10. The method of claim 8, wherein the semicrystalline thermoplastic component comprises poly(cyclohexane dimethylene terephthalate), poly(ethylene terephthalate) or poly(butylene terephthalate).

11. The method of claim 8, wherein said amorphous thermoplastic is a copolymer of bisphenol A with either isophthalic acid or a mixture isophthalic acid and terephthalic acid.

12. The method of claim 8, wherein said amorphous thermoplastic component is polyethersulfone present in an amount of from 5 to 85% by weight of the blend.

13. The method of claim 8, wherein said amorphous thermoplastic component is polyarylate present in an amount of from 1 to 25wt % of the blend.

14. The article of claim 1 in the form of a circuit board substrate.

15. The article of claim 2 in the form of a circuit board substrate.

16. The article of claim 3 in the form of a circuit board substrate.

17. A composition of matter having a heat deflection temperature of at least about 230° C. and which is especially suitable for producing selectively conductive molded articles comprising about 15–95% of the polymeric matrix by weight of poly(cyclohexylene dimethylene terephthalate) and about 85–5% of the polymeric matrix by weight polyethersulfone.

18. A composition of matter having a heat deflection temperature of at least about 230° C. and which is especially suitable for producing selectively conductive molded articles comprising about 75–99% of the polymeric matrix by weight poly(cyclohexylene dimethylene terephthalate) and about 25–1% of the polymeric matrix by weight polyarylate.

* * * * *